United States Patent
Matsushita (10) Patent No.: US 7,986,019 B2
(45) Date of Patent: Jul. 26, 2011

(54) SOLID-STATE IMAGING DEVICE AND ITS MANUFACTURING METHOD

(75) Inventor: Yoshihiro Matsushita, Kyoto (JP)

(73) Assignee: Panasonic Corporation, Osaka (JP)

( * ) Notice: Subject to any disclaimer, the term of this patent is extended or adjusted under 35 U.S.C. 154(b) by 242 days.

(21) Appl. No.: 12/400,447

(22) Filed: Mar. 9, 2009

(65) Prior Publication Data

US 2009/0224348 A1    Sep. 10, 2009

(30) Foreign Application Priority Data

Mar. 10, 2008  (JP) .................................. 2008-059434

(51) Int. Cl.
*H01L 31/0232* (2006.01)

(52) U.S. Cl. ................................. 257/432; 257/E31.127
(58) Field of Classification Search .................. 257/432, 257/E31.127; 438/69
See application file for complete search history.

(56) References Cited

U.S. PATENT DOCUMENTS

| 2005/0161585 A1 | 7/2005 | Nakashima et al. |
| 2007/0090419 A1 | 4/2007 | Lee |
| 2009/0085137 A1* | 4/2009 | Kuriyama ..................... 257/432 |

FOREIGN PATENT DOCUMENTS

| JP | 04-012568 | 1/1992 |
| JP | 06-061462 | 3/1994 |
| JP | 11-040787 | 2/1999 |

* cited by examiner

*Primary Examiner* — Mark Prenty
(74) *Attorney, Agent, or Firm* — McDermott Will & Emery LLP (57) ABSTRACT

A solid-state imaging device includes a semiconductor substrate having a photoelectric conversion region, a first microlens provided above the semiconductor substrate, covering the photoelectric conversion region, and having a convex upper surface, for gathering external light into the photoelectric conversion region, and a second microlens provided above the first microlens and having a convex upper surface, for gathering external light into the first microlens. A flat surface is provided at a top portion of one of the first and second microlenses and immediately above the photoelectric conversion region.

7 Claims, 9 Drawing Sheets

SOLID-STATE IMAGING DEVICE AND ITS MANUFACTURING METHOD

CROSS REFERENCE TO RELATED APPLICATION

This application claims priority from Japanese Patent Application JP2008-059434 filed on Mar. 10, 2008, the disclosure of which application is hereby incorporated by reference into this application in its entirety for all purposes.

BACKGROUND OF THE INVENTION

Description of the Related Art

The present disclosure relates to a solid-state imaging device having a microlens and a method for manufacturing the solid-state imaging device.

Solid-state imaging devices for use in digital cameras, camcorders and the like are being modified to achieve a larger number of pixels and further miniaturization so as to increase the resolution of the camera. Since there is a demand for a camera having a still higher resolution, it is expected that the development of a further miniaturized solid-state imaging device having a larger number of pixels will be further accelerated. As the number of pixels of a solid-state imaging device is increased while the solid-state imaging device is further miniaturized, the size of each pixel of the solid-state imaging device decreases. In this case, the sensitivity of the solid-state imaging device, which is one of the basic properties, is likely to decrease, leading to a difficulty in capturing a clear image under a predetermined illuminance.

To solve such a problem, there is a known technique in which a microlens made of an organic polymer material is formed on a color filter to improve photosensitivity (see, for example, Japanese Unexamined Patent Application Publication No. H04-12568). There is another known technique in which a so-called inner-layer lens that is formed in a multi-layer structure including a photodetector and a color filter, is used in combination with the microlens, thereby improving photosensitivity (see, for example, Japanese Unexamined Patent Application Publication No. H11-40787).

SUMMARY OF THE INVENTION

However, as the number of pixels of a solid-state imaging device is increased while the solid-state imaging device is miniaturized, electric charge is more likely to leak into a charge transfer unit, so that a smear occurs. The smear degrades image quality. For a Charge Coupled Device (CCD) for moving images, which cannot employ a mechanical shutter, it is not possible to remove a smear component remaining in a charge transfer unit, so that a deterioration in image quality due to the smear becomes significant.

A factor responsible for the occurrence of such a smear is the incidence of external light in an oblique direction with respect to a photoelectric conversion device. In this case, oblique incident light is converted into electricity in the vicinity of a charge transfer unit, so that the resultant electric charge leaks into the charge transfer unit.

Figure 10:
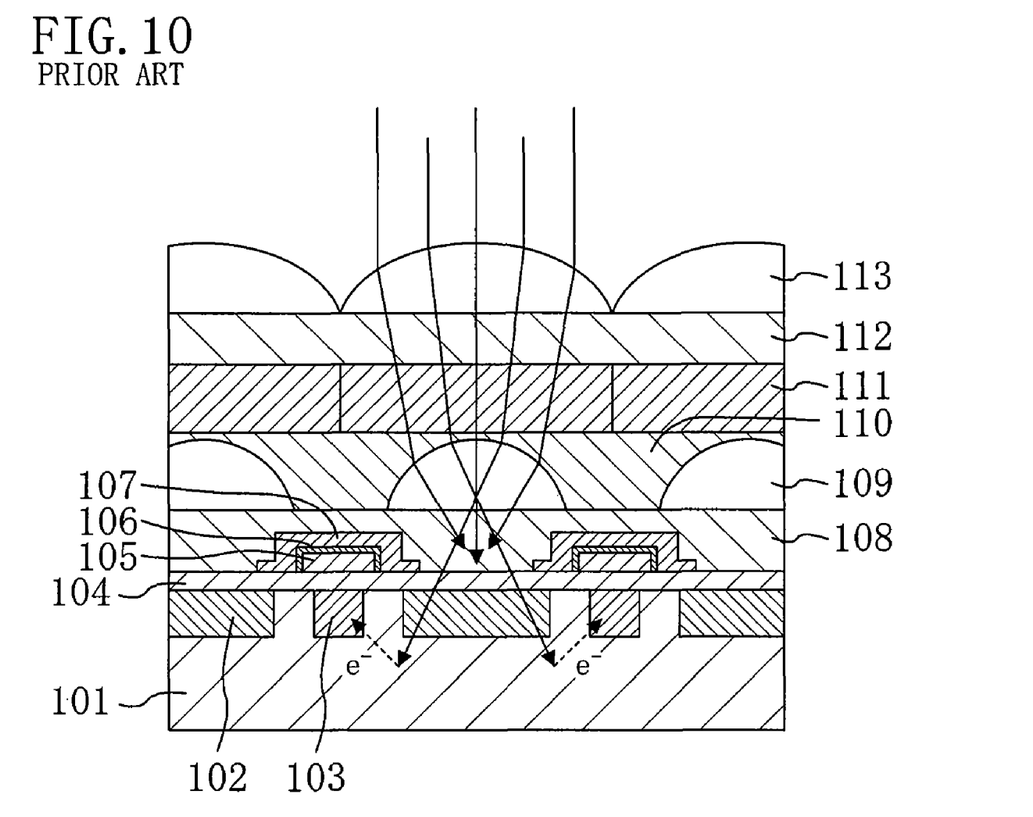
FIG. 10 is a cross-sectional view according to a configuration of a conventional solid-state imaging device.

Hereinafter, a conventional solid-state imaging device will be described with reference to FIG. 10 (see, for example, Japanese Unexamined Patent Application Publication No. H11-40787). FIG. 10 is a cross-sectional view showing a configuration of the conventional solid-state imaging device. As shown in FIG. 10, the conventional solid-state imaging device includes: a semiconductor substrate 101 made of silicon or the like; a plurality of photoelectric conversion device regions 102 and a plurality of transfer channel regions 103 provided in the semiconductor substrate 101; an insulating film 104 made of a silicon oxide film or the like provided on the semiconductor substrate 101; transfer electrodes 105 formed on the transfer channel regions 103 with the insulating film 104 being interposed therebetween; and a light shield film 107 that covers the transfer electrodes 105 and has opening portions exposing respective upper surfaces of the photoelectric conversion device regions 102. The conventional solid-state imaging device further includes: a first planarization layer 108 provided on the light shield film 107 and an insulating film 106; a plurality of first microlenses 109 each having an upward-convex curved surface that are provided on the first planarization layer 108 and above the respective photoelectric conversion device regions 102; a second planarization layer 110, a color filter layer 111 and a third planarization layer 112 provided on the first microlenses 109 in this stated order from the bottom; and a plurality of second microlenses 113 each having an upward-convex curved surface that are provided on the third planarization layer 112 and above the respective first microlenses 109.

In this conventional solid-state imaging device, the first microlens (inner-layer lens) is provided in addition to the second microlens, so that light gathering efficiency is improved, but a larger amount of oblique incident light components is likely to enter the photoelectric conversion device region 102. In this case, as described above, the oblique incident light is converted into electricity in the vicinity of a charge transfer unit, so that a smear occurs, leading to a deterioration in an image. If the light gathering efficiency of the microlens is enhanced so as to achieve a lower profile of a solid-state imaging device in addition to a larger number of pixels and further miniaturization in the future, a still larger amount of oblique incident light components is likely to enter the photoelectric conversion device region. This problem was first found by the present inventor.

According to examples of a solid-state imaging device and its manufacturing method disclosed herein, it is possible to reduce the amount of oblique incident light component entering the photoelectric conversion region, so that the deterioration of an image due to the occurrence of a smear can be suppressed.

To solve the aforementioned problems, a solid-state imaging device according to an example of the present invention includes a semiconductor substrate having a photoelectric conversion region, a first microlens provided above the semiconductor substrate, covering the photoelectric conversion region, and having a convex upper surface, for gathering external light into the photoelectric conversion region, and a second microlens provided above the first microlens and having a convex upper surface, for gathering external light into the first microlens. A flat surface is provided at a top portion of one of the first and second microlenses and immediately above the photoelectric conversion region.

With this configuration, a flat surface positioned immediately above the photoelectric conversion region is provided on at least one of the first and second microlenses. Therefore, external light can be gathered via the flat surface into the photoelectric conversion region. External light passing through the flat surface enters the photoelectric conversion region perpendicularly or at a relatively small angle of incidence, so that the light can be gathered into a middle portion of the photoelectric conversion region. As a result, in the solid-state imaging device of the present invention, it is possible to reduce the amount of oblique incident light entering the photoelectric conversion region. In other words, it is possible to suppress the situation that oblique incident light is converted into electricity in the vicinity of a charge transfer unit, and the resultant electric charge leaks into the charge transfer unit. As a result, the occurrence of a smear is suppressed, so that a solid-state imaging device having a satisfactory image characteristic can be achieved.

The solid-state imaging device preferably further includes a light shield film provided between the semiconductor substrate and the first microlens, and having an opening portion positioned immediately above the photoelectric conversion region. The flat surface is preferably provided in a region within the opening portion as viewed from the top.

The flat surface may have an area smaller than or equal to that of the opening portion.

The flat surface may be provided at a top portion of each of the first and second microlenses.

The flat surface of the first microlens may have an area smaller than that of the flat surface of the second microlens and smaller than that of the opening portion.

Alternatively, the flat surface of the first microlens may have an area larger than that of the flat surface of the second microlens and smaller than that of the opening portion.

The flat surface may be in the shape of a quadrangle.

A method according to another example of the present invention is provided for manufacturing a solid-state imaging device including a first microlens and a second microlens provided above a photoelectric conversion region provided in a semiconductor substrate. The method includes the steps of (a) depositing a first microlens forming film over the semiconductor substrate, (b) processing the first microlens forming film to form the first microlens provided above the semiconductor substrate, covering the photoelectric conversion region, and having a convex upper surface, (c) depositing a second microlens forming film above the first microlens, and (d) processing the second microlens forming film to form the second microlens provided above the first microlens, covering the photoelectric conversion region, and having a convex upper surface. Step (b) includes (e) forming a flat surface at a top portion of the first microlens and within the photoelectric conversion region as viewed from the top.

With this method, the first microlens having a flat surface positioned immediately above the photoelectric conversion region can be formed by step (e). Therefore, light entering the first microlens can be gathered via the flat surface into a middle portion of the photoelectric conversion region. Therefore, by using the solid-state imaging device manufacturing method, it is possible to reduce the amount of oblique incident light entering the photoelectric conversion region. As a result, the occurrence of a smear is suppressed, so that a solid-state imaging device having a satisfactory image characteristic can be achieved.

Note that, in step (d), a flat surface may be formed at a top portion of the second microlens and within the photoelectric conversion region as viewed from the top. In this case, a flat surface can be formed on the second microlens as well as on the first microlens, so that external light can be efficiently gathered via the flat surface of the second microlens and the flat surface of the first microlens into the photoelectric conversion region.

Step (e) may include (f) depositing a treatment film covering the first microlens after forming the first microlens, (g) simultaneously etching the treatment film and an upper portion of the first microlens, and (h) after step (g), removing the treatment film.

The first microlens forming film may be made of a thermoplastic resin. Step (e) may include placing a die having a flat portion on the first microlens forming film and pressing the die against the first microlens forming film, and curing the first microlens forming film by heating while pressing the die against the first microlens forming film.

The first microlens forming film may be made of a photo-curable resin. Step (e) may include placing a die having a flat portion on the first microlens forming film and pressing the die against the first microlens forming film, and curing the first microlens forming film by irradiation with light while pressing the die against the first microlens forming film.

The first microlens forming film may be made of a photo-sensitive material. Step (e) may include (i) performing exposure with respect to the first microlens forming film through a grayscale mask, and after step (i), performing development with respect to the first microlens forming film.

The first microlens forming film may be made of a photo-sensitive material. Step (b) may include (j) performing exposure and development with respect to the first microlens forming film into a rectangular shape, and (k) after step (j), performing a thermal flow technique with respect to the first microlens forming film by heating at a glass transition temperature or higher to form the first microlens having an upward-convex curved surface. Step (e) may include, after step (k), pressing a flat plate against the first microlens having the upward-convex curved surface.

Step (d) may include forming a flat surface at a top portion of the second microlens and within the photoelectric conversion region as viewed from the top.

The method may further include, before step (a), forming, over the semiconductor substrate, a light shield film having an opening portion exposing an upper surface of the photoelectric conversion region. The flat surface may have an area smaller than or equal to that of the opening portion.

A method according to another example of the present invention is provided for manufacturing a solid-state imaging device including a first microlens and a second microlens provided above a photoelectric conversion region provided in a semiconductor substrate. The method includes the steps of (a) depositing a first microlens forming film over the semiconductor substrate, (b) processing the first microlens forming film to form the first microlens provided above the semiconductor substrate, covering the photoelectric conversion region, and having a convex upper surface, (c) depositing a second microlens forming film above the first microlens, and (d) processing the second microlens forming film to form the second microlens provided above the first microlens, covering the photoelectric conversion region, and having a convex upper surface. Step (d) includes: (l) forming a flat surface at a top portion of the second microlens and within the photoelectric conversion region as viewed from the top.

With this method, the second microlens having a flat surface positioned immediately above the photoelectric conversion region can be formed by step (l). Therefore, light entering the second microlens can be gathered via the flat surface into a middle portion of the photoelectric conversion region. Therefore, by using the solid-state imaging device manufacturing method, it is possible to reduce the amount of oblique incident light entering the photoelectric conversion region. As a result, the occurrence of a smear is suppressed, so that a solid-state imaging device having a satisfactory image characteristic can be achieved.

Step (l) may includes (m) depositing a treatment film covering the second microlens after forming the second microlens, (n) simultaneously etching the treatment film and an upper portion of the second microlens, and (o) after step (n), removing the treatment film.

The second microlens forming film may be made of a thermoplastic resin. Step (l) may include placing a die having a flat portion on the second microlens forming film and pressing the die against the second microlens forming film, and curing the second microlens forming film by heating while pressing the die against the second microlens forming film.

The second microlens forming film may be made of a photocurable resin. Step (l) may include placing a die having a flat portion on the second microlens forming film and pressing the die against the second microlens forming film, and curing the second microlens forming film by irradiation with light while pressing the die against the second microlens forming film.

The second microlens forming film may be made of a photosensitive material. Step (l) may include (p) performing exposure with respect to the second microlens forming film through a grayscale mask, and after step (p), performing development with respect to the second microlens forming film.

The second microlens forming film may be made of a photosensitive material. Step (d) may include (q) performing exposure and development with respect to the second microlens forming film into a rectangular shape, and (r) after step (q), performing a thermal flow technique with respect to the second microlens forming film by heating at a glass transition temperature or higher to form the second microlens having an upward-convex curved surface. Step (l) may include, after step (r), pressing a flat plate against the second microlens having the upward-convex curved surface.

According to examples of a solid-state imaging device and its manufacturing method of the present invention, the incidence of oblique incident light into the photoelectric conversion region can be suppressed, so that a deterioration in an image due to a smear can be prevented. Therefore, even if the number of pixels is increased and a solid-state imaging device is further miniaturized, the solid-state imaging device can achieve high reliability.

DETAILED DESCRIPTION OF THE PREFERRED EMBODIMENTS

Hereinafter, solid-state imaging devices and their manufacturing methods according to embodiments of the present invention will be described with reference to the accompanying drawings.

First Embodiment

Figure 1A:
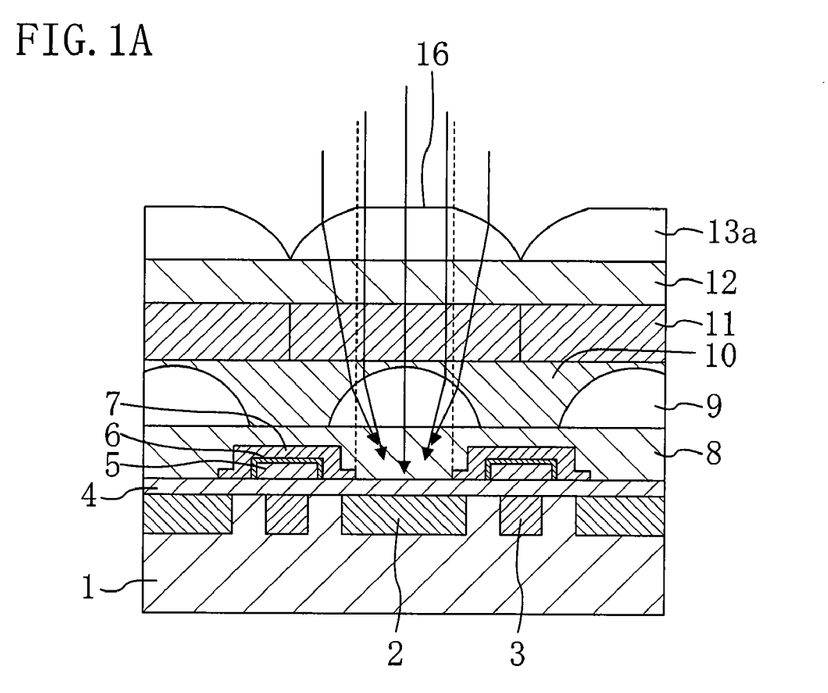
FIG. 1A is a cross-sectional view showing a configuration of a solid-state imaging device according to a first embodiment of the present invention.

FIG. 1A is a cross-sectional view showing a configuration of a solid-state imaging device according to this embodiment. As shown in FIG. 1A, the solid-state imaging device of this embodiment includes: a semiconductor substrate 1 made of silicon or the like; a photoelectric conversion region (photoelectric conversion device region) 2 and a transfer channel region 3 provided in the semiconductor substrate 1; a first insulating film 4 provided on an entire surface of the semiconductor substrate 1; a transfer electrode 5 provided on the transfer channel region 3 with the first insulating film 4 being interposed therebetween; a second insulating film 6 covering a side surface and an upper surface of the transfer electrode 5; a light shield film 7 provided on the first insulating film 4, extending over a side surface and an upper surface of the second insulating film 6, and having an opening portion directly above the photoelectric conversion region 2; a first planarization layer 8 provided on the light shield film 7 and the first insulating film 4, with which the opening portion of the light shield film 7 is filled; and a first microlens 9 provided on the first planarization layer, covering the photoelectric conversion region 2, for gathering external light into the photoelectric conversion region 2.

The solid-state imaging device of this embodiment further includes: a second planarization layer 10 provided on the first microlens 9; a color filter layer 11 provided on the second planarization layer 10 and directly above the photoelectric conversion region 2; a third planarization layer 12 provided on the color filter layer 11; and a second microlens 13a having a larger area as viewed from the top (plane area) than that of the first microlens 9 and provided on the third planarization layer 12, covering the photoelectric conversion region 2, for gathering external light into the first microlens 9.

In the solid-state imaging device of this embodiment, the first microlens 9 and the second microlens 13a each have an upward-convex upper surface, and the second microlens 13a has, at a top portion thereof, a flat surface 16 that is positioned directly above the photoelectric conversion region 2. The flat surface 16 is formed in parallel with a surface of the semiconductor substrate 1. The flat surface 16 will be described in greater detail with reference to FIG. 1B.

Figure 1B:
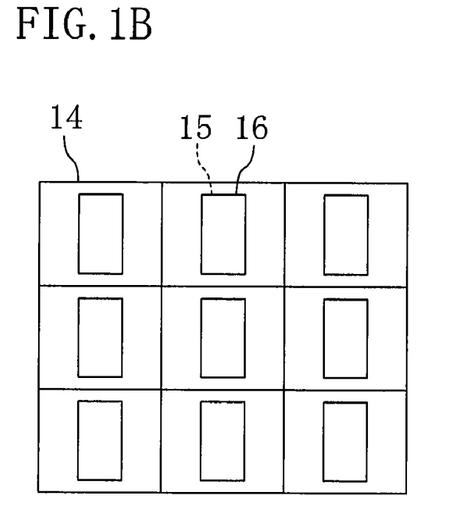
FIGS. 1B and 1C are plan views showing a configuration of the solid-state imaging device of the first embodiment.

FIG. 1B is a plan view showing a configuration of a solid-state imaging device according to this embodiment. As shown in FIG. 1B, in the solid-state imaging device of this embodiment, a plurality of pixels 14 each having the photoelectric conversion region 2 are arranged in a matrix. The flat surface 16 of the second microlens 13a provided in each pixel 14 is provided in a region positioned directly above the photoelectric conversion region 2 and the opening portion 15 provided in the light shield film 7, and has substantially the same area as that of the opening portion 15.

With this configuration, light that has entered and transmitted through the second microlens 13a, travels in straight lines through the third planarization layer 12, the color filter layer 11 and the second planarization layer 10, and then enters the first microlens 9. The light is refracted by a surface of the first microlens 9 before entering the photoelectric conversion region 2. In this case, since the second microlens 13a has the flat surface 16 that is provided in a region positioned directly above the photoelectric conversion region 2, external light that has passed through the flat surface 16 can enter the first microlens 9 perpendicularly. This perpendicular incident light is refracted by the surface of the first microlens 9, so that it can enter the photoelectric conversion region 2 at a smaller angle of incidence than that of the conventional solid-state imaging device. Therefore, in the solid-state imaging device of this embodiment, external light can be gathered to a middle portion of the photoelectric conversion region 2. Therefore, it is possible to reduce the amount of oblique incident light entering the photoelectric conversion region 2. In other words, it is possible to suppress the situation that oblique incident light is converted into electricity in the vicinity of the transfer channel region 3, and the resultant electric charge leaks into the transfer channel region 3. As a result, the occurrence of a smear is suppressed, so that a solid-state imaging device having a satisfactory image characteristic can be achieved.

Figure 1C:
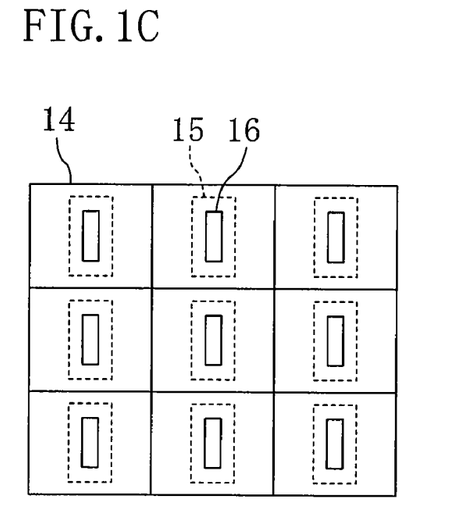

Note that the area of the flat surface 16 of the second microlens 13a is preferably smaller than or equal to that of the opening portion 15. This is because, in this case, external light entering the flat surface 16 can be efficiently gathered into the photoelectric conversion region 2. More preferably, the area of the flat surface 16 is smaller than that of the opening portion 15. FIG. 1C is a plan view showing a configuration of a solid-state imaging device according to a variation of this embodiment. As shown in FIG. 1C, in the solid-state imaging device of this variation of the embodiment, the area of the flat surface 16 is smaller than that of the opening portion 15. In this case, for example, even if the curvature of the second microlens 13a is small, so that the light gathering power is low, the light gathering efficiency of the second microlens 13a can be improved, thereby making it possible to gather sufficient external light into the photoelectric conversion region 2.

Second Embodiment

Figure 2A:
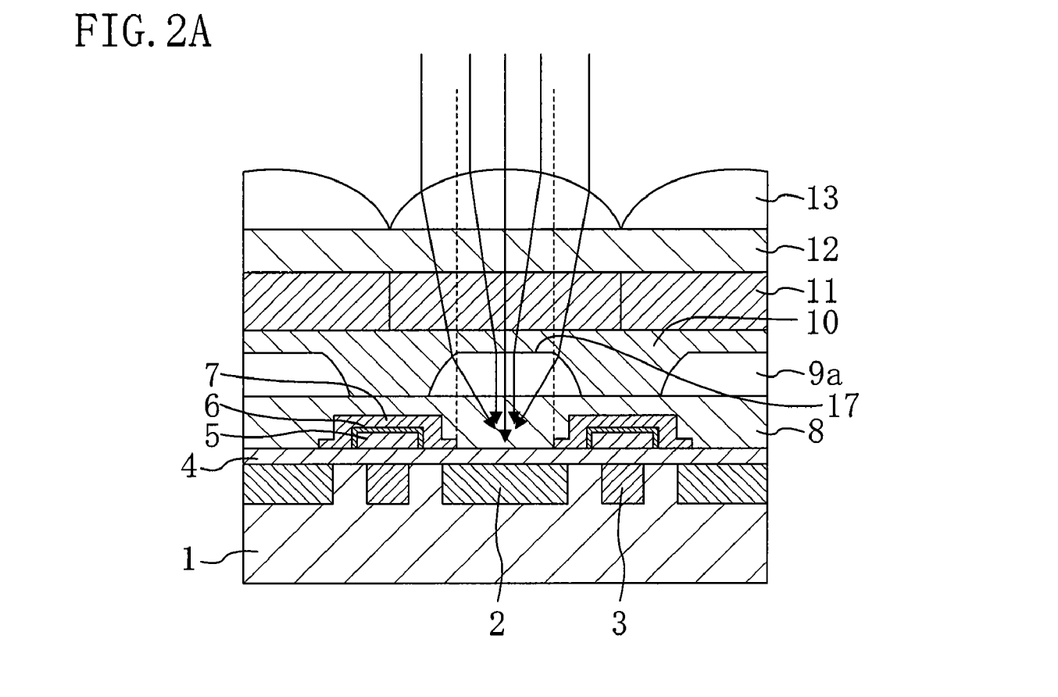
FIG. 2A is a cross-sectional view showing a configuration of a solid-state imaging device according to a second embodiment of the present invention.

FIG. 2A is a cross-sectional view showing a configuration of a solid-state imaging device according to a second embodiment of the present invention. Note that the solid-state imaging device of this embodiment is different from that of the first embodiment in only a portion of the configuration. Therefore, the same parts as those of the first embodiment are indicated by the same reference symbols and will not be described.

As shown in FIG. 2A, in the solid-state imaging device of this embodiment, a first microlens 9a and a second microlens 13 each have an upward-convex upper surface. The first microlens 9a has, at a top portion thereof, a flat surface 17 positioned directly above a photoelectric conversion region 2. The flat surface 17 is formed in parallel with a surface of a semiconductor substrate 1. The flat surface 17 will be described in greater detail with reference to FIG. 2B. Note that the solid-state imaging device of this embodiment has a configuration similar to that of the first embodiment, except for the first microlens 9a and the second microlens 13.

Figure 2B:
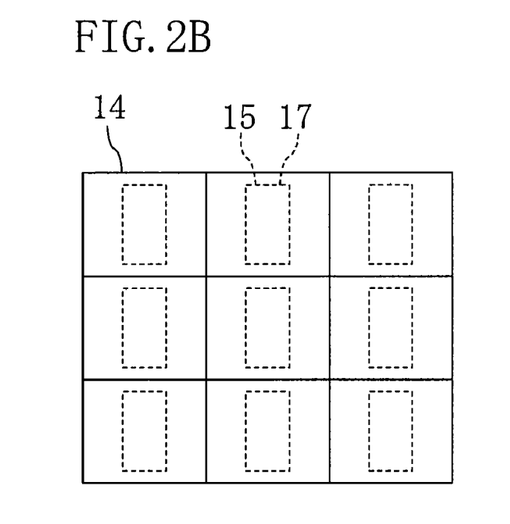
FIGS. 2B and 2C are plan views showing a configuration of the solid-state imaging device of the second embodiment.

FIG. 2B is a plan view showing a configuration of the solid-state imaging device of this embodiment. As shown in FIG. 2B, in the solid-state imaging device of this embodiment, a plurality of pixels 14 each having the photoelectric conversion region 2 are arranged in a matrix. The flat surface 17 of the first microlens 9a provided in each pixel 14 is provided in a region positioned directly above the photoelectric conversion region 2 and an opening portion 15 provided in the light shield film 7. The flat surface 17 also has the same area as that of the opening portion 15.

With this configuration, external light that has entered and transmitted through the second microlens 13, travels through a third planarization layer 12, a color filter layer 11 and a second planarization layer 10, and then enters the first microlens 9a. Since the first microlens 9a has the flat surface 17 at a region positioned directly above the photoelectric conversion region 2, oblique incident light entering the flat surface 17 of the first microlens 9a is refracted by the flat surface 17, so that the light becomes incident light perpendicular to the photoelectric conversion region 2 and enters the photoelectric conversion region 2. As a result, it is possible to efficiently gather external light into a middle portion of the photoelectric conversion region 2. Therefore, in the solid-state imaging device of this embodiment, it is possible to reduce the amount of oblique incident light entering the photoelectric conversion region 2. In other words, it is possible to suppress the situation that oblique incident light is converted into electricity in the vicinity of a transfer channel region 3, and the resultant electric charge leaks into the transfer channel region 3. As a result, the occurrence of a smear is suppressed, so that a solid-state imaging device having a satisfactory image characteristic can be achieved.

For example, when the second planarization layer 10 provided on the first microlens 9a is made of a material having a refractive index of 1.4 to 1.7 and the first microlens 9a is made of a material having a refractive index of 1.9 to 2.1, a difference in refractive index between the second planarization layer 10 and the first microlens 9a is relatively small. Therefore, in this case, the angle of incidence of oblique incident light that enters the photoelectric conversion region 2 after entering the flat surface of the first microlens 9a can be reduced, so that a larger amount of perpendicular light components is allowed to enter the photoelectric conversion region 2. Thus, by selecting the materials for the microlens and the planarization layer on the microlens in view of their refractive indexes, it is possible to more efficiently gather external light into a middle region of the photoelectric conversion region 2.

Figure 2C:
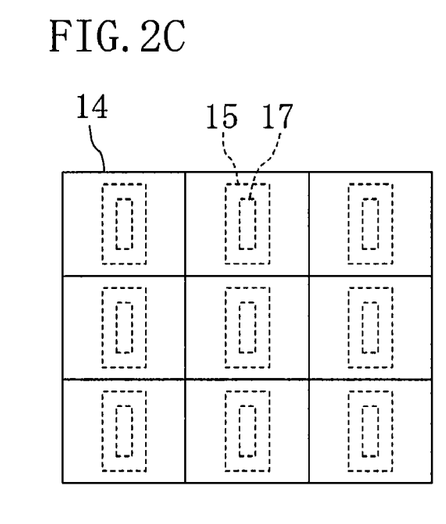

Note that the area of the flat surface 17 of the first microlens 9a is preferably smaller than or equal to that of the opening portion 15. This is because, in this case, external light can be efficiently gathered into the photoelectric conversion region 2. More preferably, the area of the flat surface 17 is smaller than that of the opening portion 15. FIG. 2C is a plan view showing a configuration of a solid-state imaging device according to a variation of this embodiment. As shown in FIG. 2C, in the solid-state imaging device of this variation of the embodiment, the area of the flat surface 17 is smaller than that of the opening portion 15. In this case, for example, even if the curvature of the first microlens 9a is small, so that the light gathering power is low, the light gathering efficiency of the first microlens 9a can be improved, thereby making it possible to gather sufficient external light into the photoelectric conversion region 2.

Third Embodiment

Figure 3A:
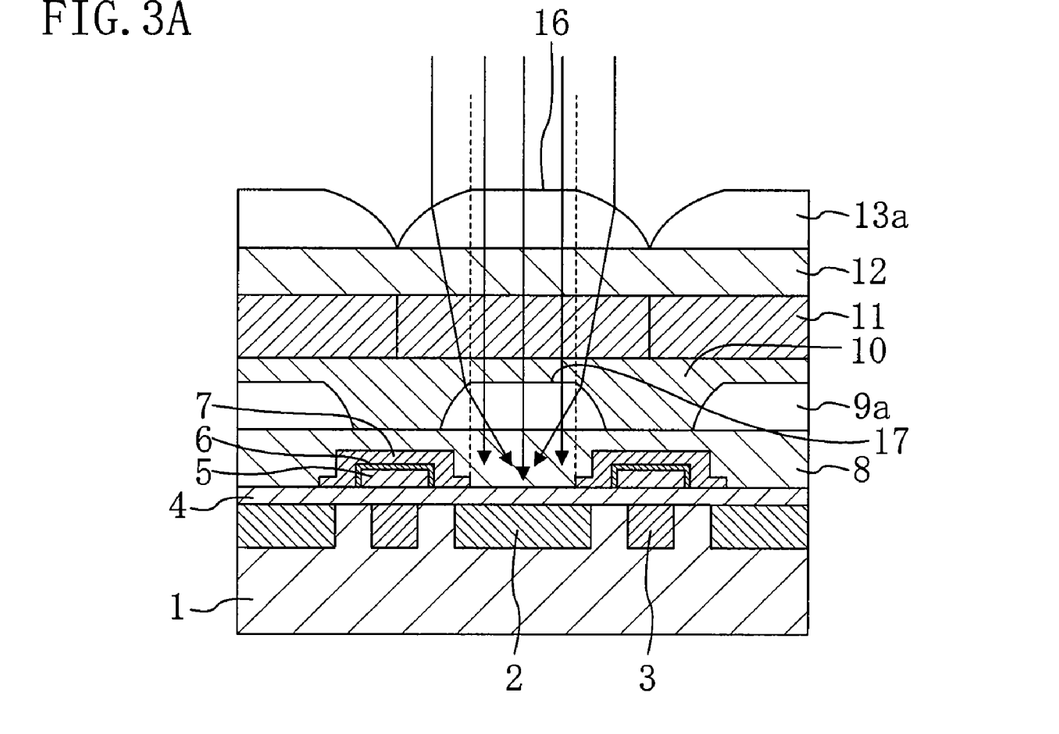
FIG. 3A is a cross-sectional view showing a configuration of a solid-state imaging device according to a third embodiment of the present invention.

FIG. 3A is a cross-sectional view showing a configuration of a solid-state imaging device according to a third embodiment of the present invention. Note that the solid-state imaging device of this embodiment is different from that of the first embodiment in only a portion of the configuration. Therefore, the same parts as those of the first embodiment are indicated by the same reference symbols and will not be described.

As shown in FIG. 3A, in the solid-state imaging device of this embodiment, a first microlens 9a and a second microlens 13a each have an upward-convex upper surface. The first and second microlenses 9a and 13a also have, at respective top portions thereof, respective flat surfaces 17 and 16 positioned directly above a photoelectric conversion region 2. The flat surfaces 17 and 16 are formed in parallel with a surface of a semiconductor substrate 1. The flat surfaces 17 and 16 will be described in greater detail with reference to FIG. 3B. Note that the solid-state imaging device of this embodiment has a configuration similar to that of the first embodiment, except for the first microlens 9a.

Figure 3B:
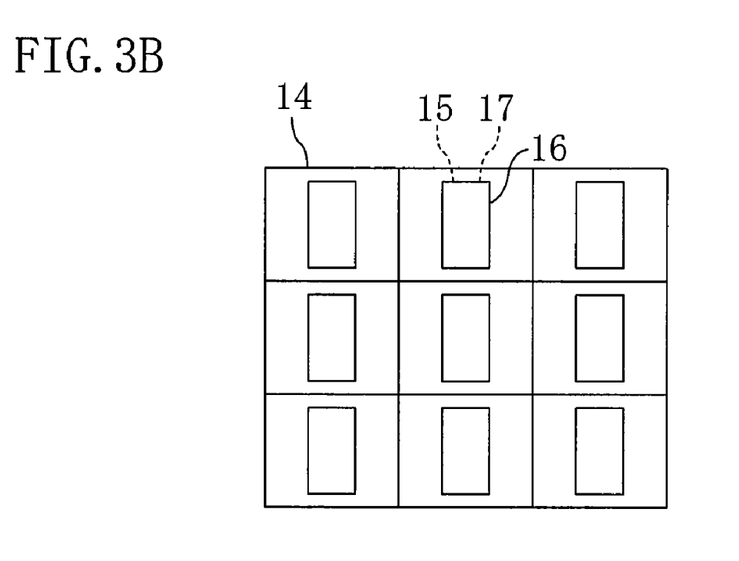
FIG. 3B is a plan view showing a configuration of the solid-state imaging device of the third embodiment.

FIG. 3B is a plan view showing a configuration of the solid-state imaging device of this embodiment. As shown in FIG. 3B, in the solid-state imaging device of this embodiment, a plurality of pixels 14 each having the photoelectric conversion region 2 are arranged in a matrix. The flat surface 17 of the first microlens 9a and the flat surface 16 of the microlens 13a provided in each pixel 14 are formed in respective regions positioned directly above the photoelectric conversion region 2 and an opening portion 15 provided in the light shield film 7. The flat surfaces 17 and 16 also each have the same area as that of the opening portion 15.

With this configuration, since both the first and second microlenses 9a and 13a have the respective flat surfaces 17 and 16 at the respective regions positioned directly above the photoelectric conversion region 2, external light that has entered and transmitted through the second microlens 13a without being refracted by the flat surface 16, travels as still perpendicular light in straight lines through a third planarization layer 12, a color filter layer 11 and a second planarization layer 10 before entering the first microlens 9a. This perpendicular light still perpendicularly travels in straight lines through the flat surface 17 of the microlens 9a before gathering to the photoelectric conversion region 2. Therefore, in the solid-state imaging device of this embodiment, it is possible to efficiently cause external light to enter the photoelectric conversion region 2. Therefore, it is possible to reduce the amount of oblique incident light entering the photoelectric conversion region 2. In other words, it is possible to suppress the situation that oblique incident light is converted into electricity in the vicinity of a transfer channel region 3, and the resultant electric charge leaks into the transfer channel region 3. As a result, the occurrence of a smear is suppressed, so that a solid-state imaging device having a satisfactory image characteristic can be achieved.

Also, in the solid-state imaging device of this embodiment, the flat surface 17 of the first microlens 9a and the flat surface 16 of the second microlens 13a have the same two-dimensional shape, which is also the same as that of the opening portion 15. Therefore, light that has entered the second microlens 13a perpendicularly, can be reliably gathered via the first microlens 9a and the opening portion 15 into the photoelectric conversion region 2.

Note that the areas of the flat surfaces 17 and 16 of the first and second microlenses 9a and 13a are each preferably smaller than or equal to that of the opening portion 15. This is because, in this case, external light can be efficiently gathered into the photoelectric conversion region 2. More preferably, the areas of the flat surfaces 17 and 16 are each smaller than that of the opening portion 15. In this case, for example, even if the curvatures of the first and second microlenses 9a and 13a are small, so that the light gathering power is low, the light gathering efficiency of the first and second microlenses 9a and 13a can be improved, thereby making it possible to gather sufficient external light into the photoelectric conversion region 2.

Figure 4:
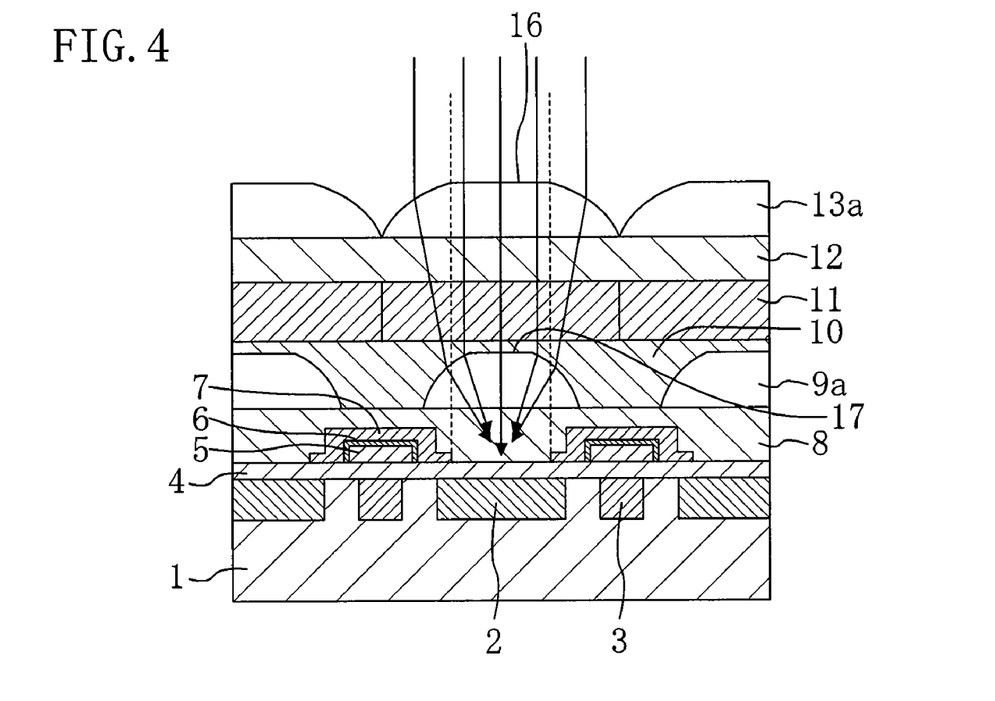
FIG. 4 is a plan view showing a configuration of a solid-state imaging device according to a first variation of the third embodiment.
Figure 5:
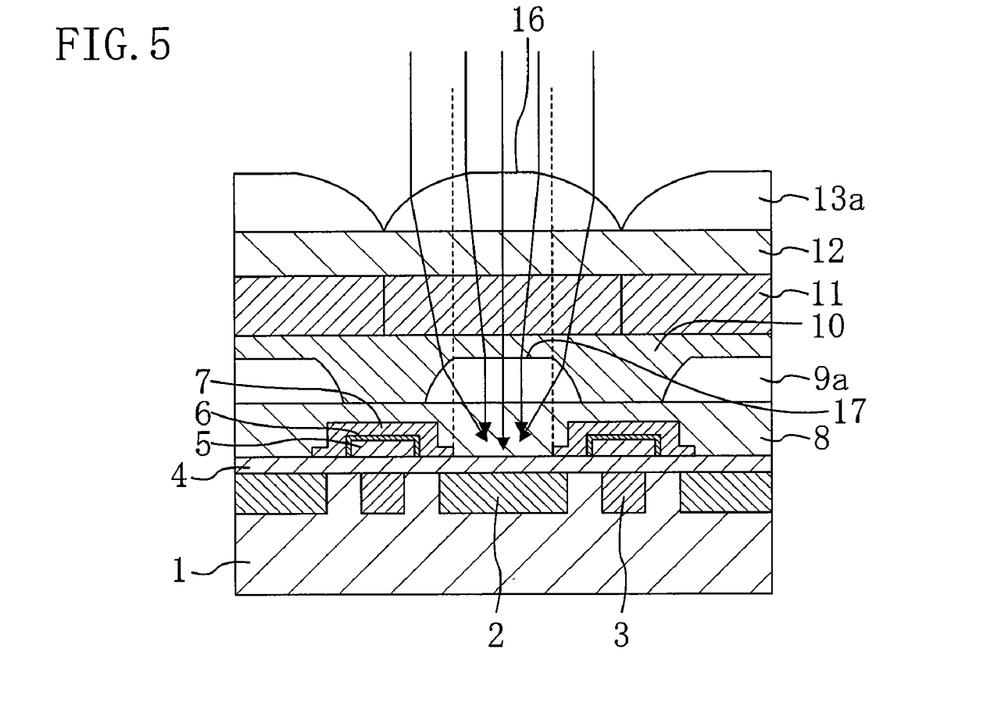
FIG. 5 is a plan view showing a configuration of a solid-state imaging device according to a second variation of the third embodiment.

Although it has been assumed in the solid-state imaging device of this embodiment above that the flat surfaces 17 and 16 of the first and second microlenses 9a and 13a have the same area, the present invention is not limited to this. The flat surfaces 17 and 16 may have different areas. This will be described with reference to FIGS. 4 and 5. FIG. 4 is a cross-sectional view showing a solid-state imaging device according to a first variation of this embodiment. FIG. 5 is a cross-sectional view showing a solid-state imaging device according to a second variation of this embodiment.

As shown in FIG. 4, in the solid-state imaging device of the first variation of this embodiment, a first microlens 9a and a second microlens 13a each have an upward-convex upper surface. The first and second microlenses 9a and 13a also have, at respective top portions thereof, respective flat surfaces 17 and 16 positioned directly above a photoelectric conversion region 2 and an opening portion provided in a light shielding film 7. The flat surfaces 17 and 16 are formed in parallel with a surface of a semiconductor substrate 1. The area of the flat surface 16 of the second microlens 13a is larger than that of the flat surface 17 of the first microlens 9a.

With this configuration, the amount of perpendicular light components of light emitted from the second microlens 13a can be increased by increasing the area of the flat surface 16 of the second microlens 13a. As a result, of the perpendicular light components emitted from the second microlens 13a, light components entering the flat surface 17 of the first microlens 9a can be reliably introduced into a middle portion of the photoelectric conversion region 2 while the light components remain perpendicular to the photoelectric conversion region 2. In addition, of the perpendicular light components, light components entering a curved surface of the first microlens 9a can be caused to enter the photoelectric conversion region 2 at a relatively small angle of incidence. Therefore, in the solid-state imaging device of the first variation of this embodiment, external light can be efficiently gathered into the photoelectric conversion region 2, so that the deterioration of the image characteristic is suppressed. As a result, even if the solid-state imaging device is further miniaturized, sufficient illuminance is obtained, so that the solid-state imaging device can achieve satisfactory sensitivity.

Next, a solid-state imaging device according to a second variation of this embodiment will be described with reference to FIG. 5. As shown in FIG. 5, a first microlens 9a and a second microlens 13a each have an upward-convex upper surface. The first and second microlenses 9a and 13a also have, at respective top portions thereof, respective flat surfaces 17 and 16 positioned directly above a photoelectric conversion region 2 and an opening portion provided in a light shielding film 7. The area of the flat surface 17 of the first microlens 9a is larger than that of the flat surface 16 of the second microlens 13a.

With this configuration, by increasing the area of the flat surface 17 of the first microlens 9a, perpendicular light emitted from the flat surface 16 of the second microlens 13a is allowed to reliably pass through the flat surface 17 of the first microlens 9a and gather into a middle portion of the photoelectric conversion region 2. In addition, light refracted by the curved surface of the second microlens 13a is allowed to enter the flat surface 17 of the first microlens 9a, so that the light can enter the photoelectric conversion region 2 at a relatively small angle of incidence. Therefore, it is possible to further reduce the amount of oblique incident light entering the photoelectric conversion region 2. As a result, in the second variation of this embodiment, even if the solid-state imaging device is further miniaturized, the occurrence of a smear can be suppressed, so that the solid-state imaging device can achieve a satisfactory image characteristic.

Fourth Embodiment

Hereinafter, first to fifth solid-state imaging device manufacturing methods according to this embodiment of the present invention will be described. Note that, in this embodiment, the solid-state imaging device of the second embodiment (see FIG. 2A) is manufactured as an example. FIGS. 6A to 6E are cross-sectional views showing the first solid-state imaging device manufacturing method of this embodiment.

In the first solid-state imaging device manufacturing method of this embodiment, a resist having an opening in a predetermined region is initially formed on the semiconductor substrate 1 made of silicon or the like by photolithography and etching (not shown). This resist is used to implant ions into the semiconductor substrate 1, thereby forming the photoelectric conversion region 2 and the transfer channel region 3. Next, the first insulating film 4 is formed on an entire surface of the semiconductor substrate 1, thereby forming the transfer electrode 5 in a region positioned on the first insulating film 4 and above the transfer channel region 3, and the second insulating film 6 covering the transfer electrode 5.

Next, the light shield film 7 made of tungsten or the like is formed on an entire surface of the semiconductor substrate 1. Thereafter, a portion of the light shield film 7 that is positioned directly above the photoelectric conversion region 2 is removed to form an opening portion exposing an upper surface of the first insulating film 4. Thus, the light shield film 7 is provided on the first insulating film 4, extending over the side and upper surfaces of the second insulating film 6, with the opening portion thereof being positioned directly above the photoelectric conversion region 2. Next, in order to eliminate a step generated by the transfer electrode 5 and the light shield film 7, the first planarization layer 8 made of Boronic Phosphoric Silicate Glass (BPSG) is formed on an entire surface of the semiconductor substrate 1.

Figure 6A:
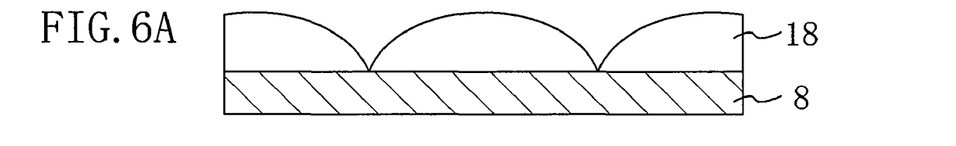
FIGS. 6A to 6E are cross-sectional views showing a first solid-state imaging device manufacturing method according to the present invention.
Figure 6B:
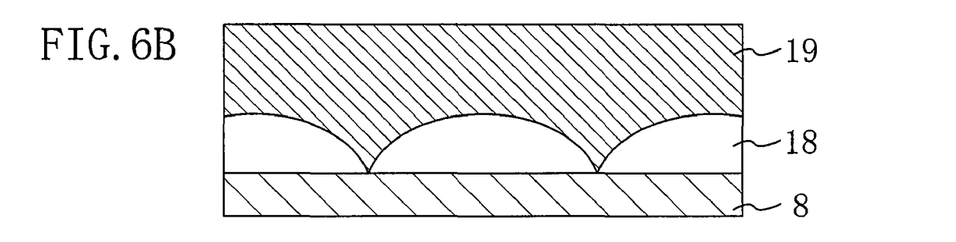

Next, as shown in FIG. 6A, a first microlens 18 having a convex upper surface is formed on the first planarization layer 8. Thereafter, as shown in FIG. 6B, a treatment film 19 having the same etching rate as that of the first microlens 18 and having a film thickness of 0.5 μm to 2.0 μm is deposited on the first microlens 18, covering the entire first microlens 18. The treatment film 19 may be deposited by spin coating.

Figure 6C:
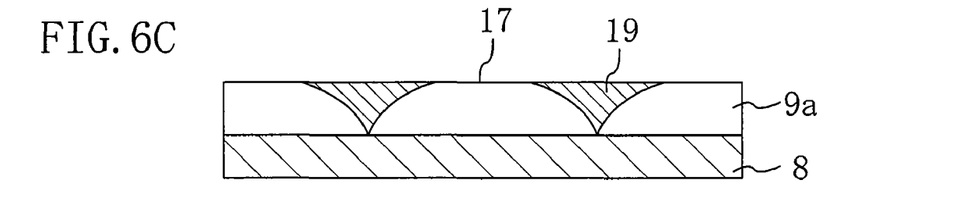
Figure 6D:
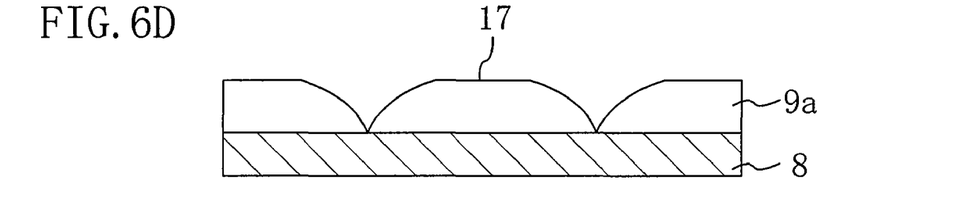

Next, as shown in FIG. 6C, the treatment film 19 and the first microlens 18 are etched to remove an upper portion of the first microlens 18. As a result, the first microlens 9a having the flat surface 17 at a top region thereof positioned directly above the photoelectric conversion region 2 is formed. Next, as shown in FIG. 6D, the treatment film 19 remaining on the semiconductor substrate 1 is removed. Note that, in this embodiment, the steps of forming the first microlens 9a having the flat surface 17 as shown in FIGS. 6A to 6D are referred to as a "flat surface forming step".

Figure 6E:
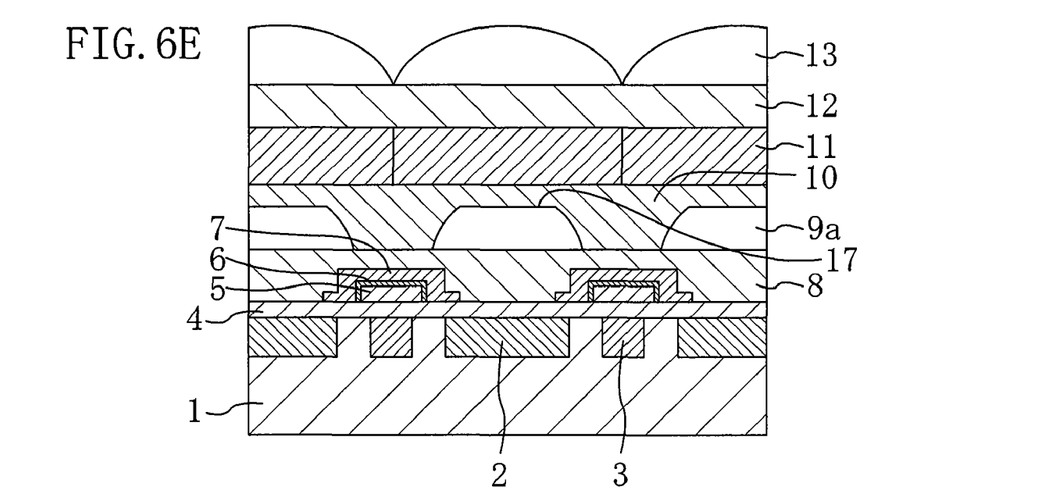

Next, as shown in FIG. 6E, in order to eliminate a step generated by the first microlens 9a, the second planarization layer 10 is formed on an entire surface of the semiconductor substrate 1. Thereafter, a material including a color material, such as a pigment, a dye or the like, is applied onto the second planarization layer 10, followed by photolithography and etching. As a result, the color filter layer 11 having a desired color filter array of primary colors, complementary colors and the like is formed, covering the first microlens 9a.

Next, the third planarization layer 12 is formed on the color filter layer 11. Next, a second microlens forming film (not shown) is formed on the third planarization layer 12, followed by predetermined processing, to form the second microlens 13 having a convex upper surface. By the steps described above, the solid-state imaging device of FIG. 2A can be manufactured.

With this first manufacturing method, the first microlens 9a having the flat surface 17 positioned directly above the photoelectric conversion region 2 is formed in the step of FIG. 6D. As a result, light entering the first microlens 9a can be gathered via the flat surface 17 into a middle portion of the photoelectric conversion region 2. Therefore, the first solid-state imaging device manufacturing method of this embodiment can be used to manufacture a solid-state imaging device having a satisfactory image characteristic in which the amount of oblique incident light entering the photoelectric conversion region 2 can be reduced, so that the occurrence of a smear can be suppressed.

Next, the second solid-state imaging device manufacturing method of this embodiment will be described. Note that the second to fifth solid-state imaging device manufacturing methods of this embodiment described below are different from that of the first manufacturing method of this embodiment in only the "flat surface forming step". Therefore, similar steps will not be described. FIGS. 7A to 7E are cross-sectional views showing the second solid-state imaging device manufacturing method of this embodiment.

Figure 7A:
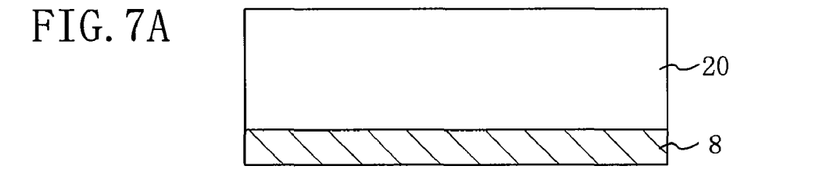
FIGS. 7A to 7E are cross-sectional views showing a second solid-state imaging device manufacturing method according to the present invention.

In the second manufacturing method of this embodiment, the first insulating film 4, the transfer electrode 5, the second insulating film 6, the light shield film 7 and the first planarization layer 8 are successively formed in the respective predetermined regions on the semiconductor substrate 1 in which the photoelectric conversion region and the transfer channel region are provided (not shown). Next, as shown in FIG. 7A, a first microlens forming film 20 made of a thermoplastic resin is applied onto the first planarization layer 8. Note that examples of the thermoplastic resin include, but are not limited to, acrylic resin, polylactic acid (PLA), polyethylene terephthalate (PET), polymethyl methacrylate (PMMA), polycarbonate (PC), and the like.

Figure 7B:
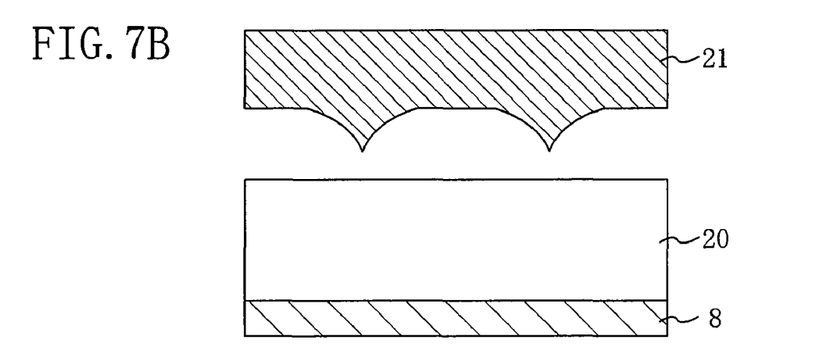
Figure 7C:
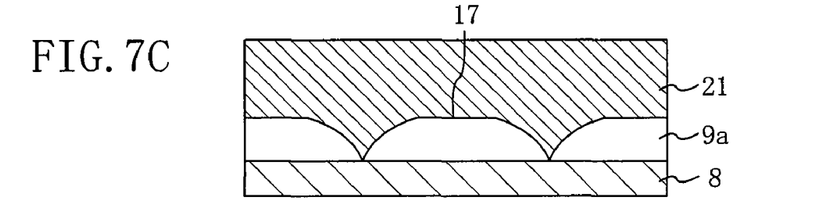
Figure 7D:
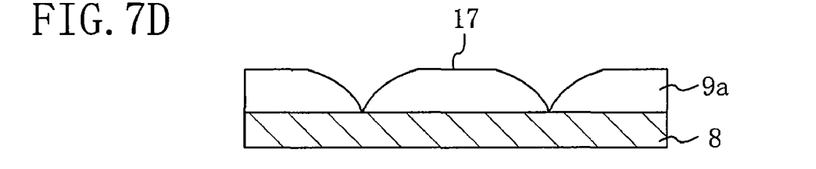
Figure 7E:
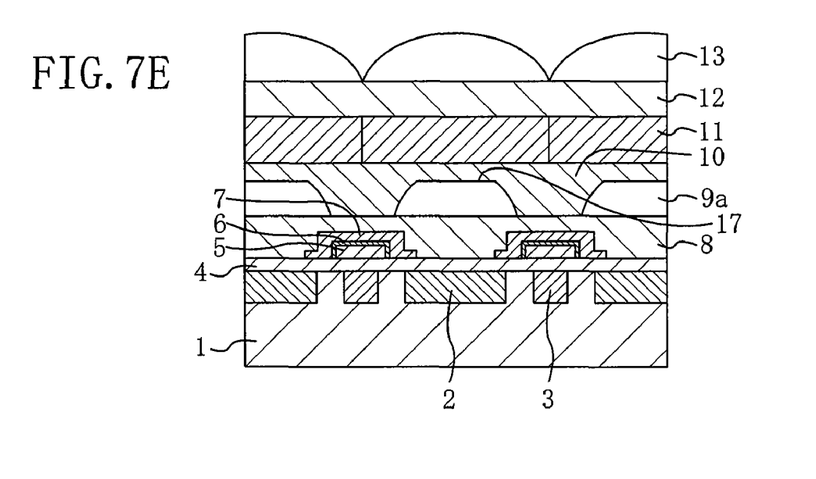

Next, as shown in FIG. 7B, a mold (die) 21 having a flat portion is placed on the first microlens forming film 20. The mold (die) 21 has a desired microlens shape that is an upward-convex shape and has a flat surface at a top portion thereof. Next, as shown in FIG. 7C, the first microlens forming film 20 is cured by heating while the mold 21 is kept pressed against the first microlens forming film 20. As a result, the first microlens 9a having the flat surface 17 at a top portion thereof positioned directly above the photoelectric conversion region 2 is formed. Next, as shown in FIG. 7D, the mold 21 is removed. Thereafter, the solid-state imaging device of FIG. 2A can be manufactured by steps similar to those of the first manufacturing method of this embodiment, though the steps will not be described in detail.

Next, the third solid-state imaging device manufacturing method of this embodiment will be described. FIGS. 8A to 8E are cross-sectional views showing the third solid-state imaging device manufacturing method of this embodiment.

Figure 8A:
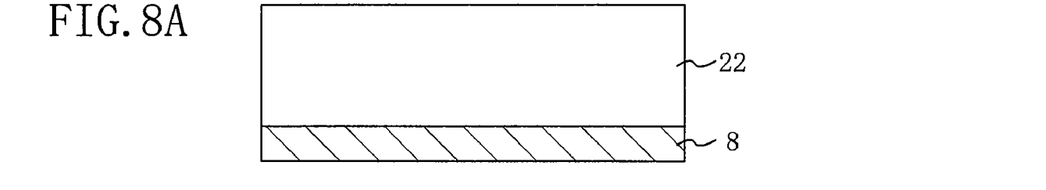
FIGS. 8A to 8E are cross-sectional views showing a third solid-state imaging device manufacturing method according to the present invention.

In the third manufacturing method of this embodiment, the first insulating film 4, the transfer electrode 5, the second insulating film 6, the light shield film 7 and the first planarization layer 8 are initially successively formed on the respective predetermined regions on the semiconductor substrate 1 on which the photoelectric conversion region 2 and the transfer channel region 3 are provided (not shown). Next, as shown in FIG. 8A, a first microlens forming film 22 made of a photocurable resin, such as an acrylic resin or the like, is applied onto the first planarization layer 8.

Figure 8B:
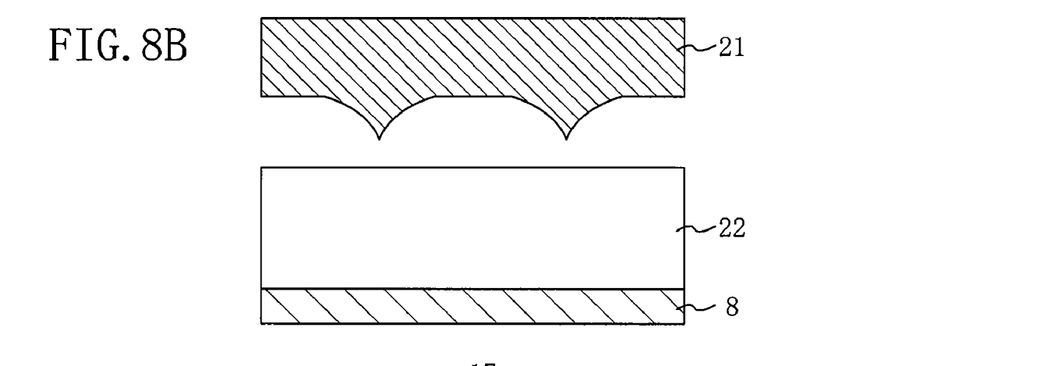
Figures 8C, 8D:
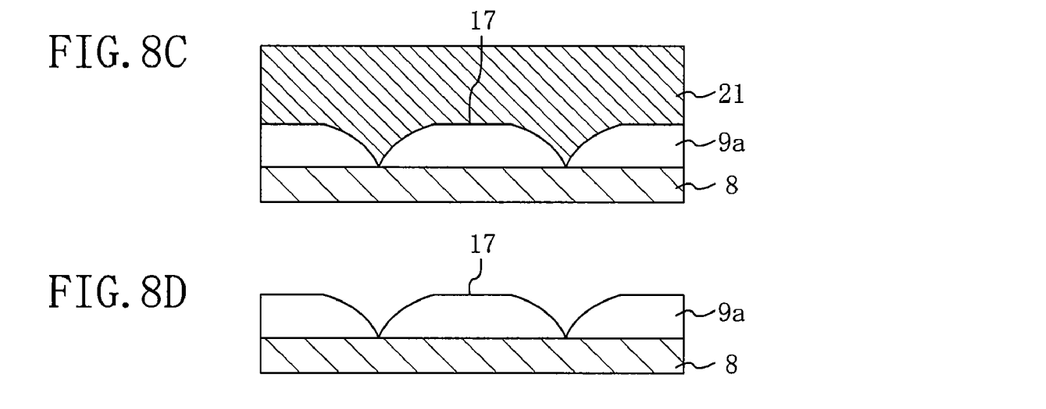
Figure 8E:
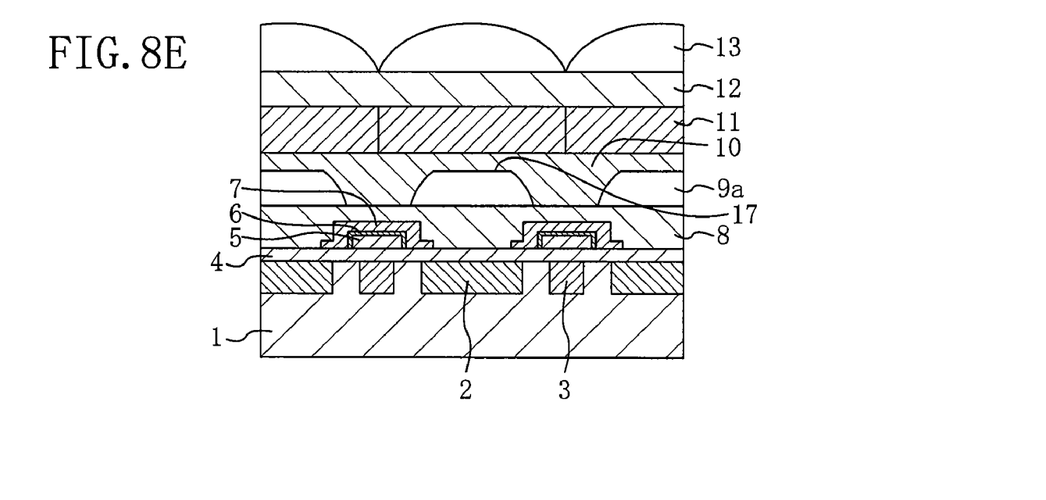

Next, as shown in FIG. 8B, the mold (die) 21 having a flat portion is placed on the first microlens forming film 22. The mold (die) 21 has a desired microlens shape that is an upward-convex shape and has a flat surface at a top portion thereof. Next, as shown in FIG. 8C, the first microlens forming film 22 is cured by irradiation with ultraviolet light while the mold 21 is kept pressed against the first microlens forming film 22. As a result, the first microlens 9a having the flat surface 17 at a top portion thereof positioned directly above the photoelectric conversion region 2 is formed. Next, as shown in FIG. 8D, the mold 21 is removed. Thereafter, the solid-state imaging device of FIG. 2A can be manufactured by steps similar to those of the first manufacturing method of this embodiment, though the steps will not be described in detail.

Next, the fourth solid-state imaging device manufacturing method of this embodiment will be described. FIGS. 9A to 9D are cross-sectional views showing the fourth solid-state imaging device manufacturing method of this embodiment.

Figure 9A:
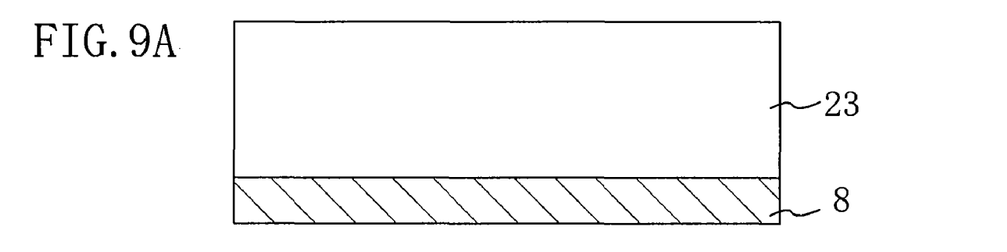
FIGS. 9A to 9D are cross-sectional views showing a fourth solid-state imaging device manufacturing method according to the present invention.

In the fourth manufacturing method of this embodiment, the first insulating film 4, the transfer electrode 5, the second insulating film 6, the light shield film 7 and the first planarization layer 8 are initially successively formed on the respective predetermined regions on the semiconductor substrate 1 on which the photoelectric conversion region 2 and the transfer channel region 3 are provided (not shown). Next, as shown in FIG. 9A, a first microlens forming film 23 made of a photocurable resin, such as an acrylic resin or the like, is applied onto the first planarization layer 8.

Next, exposure is performed through a grayscale mask with respect to the first microlens forming film 23, followed by development, to form the first microlens 9a having the flat surface 17 directly above the photoelectric conversion region 2.

Figure 9B:
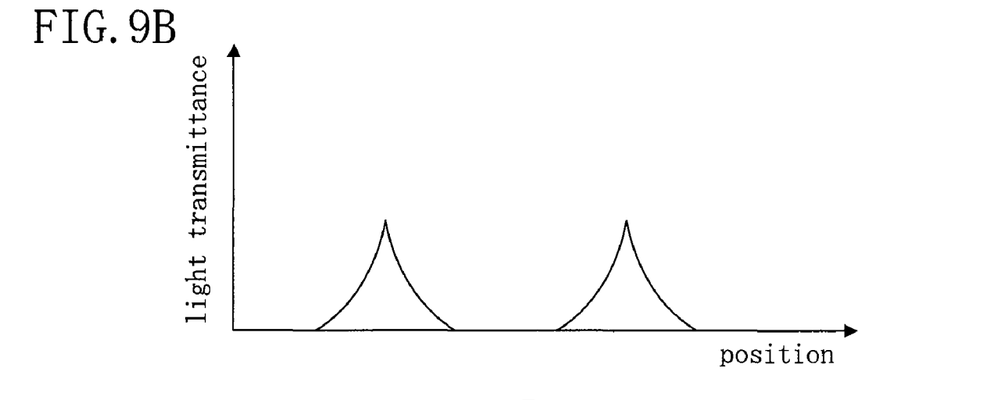
Figure 9C:
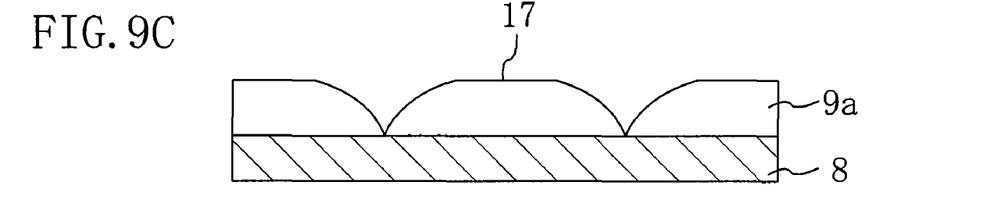
Figure 9D:
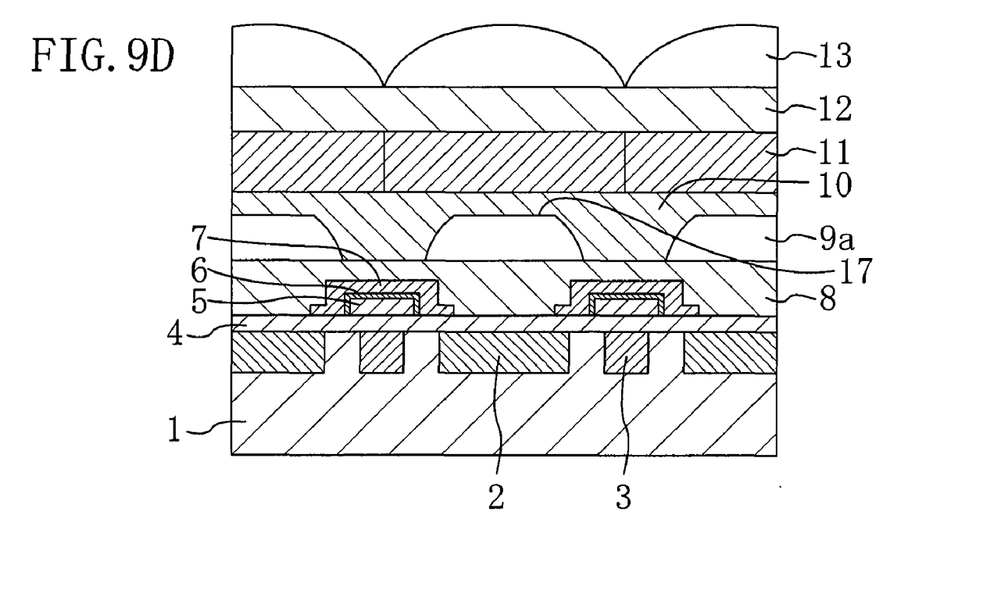

The grayscale mask used in this step will be described with reference to FIG. 9B. FIG. 9B is a diagram showing a light transmittance distribution of the grayscale mask in the fourth manufacturing method of this embodiment. As shown in FIG. 9B, the grayscale mask of this embodiment has a plurality of transmittance distribution ranges in a major surface direction. The light transmittance is low at a position corresponding to a flat surface. The light transmittance increases toward a position corresponding to the outer periphery of a microlens, and is maximum at the outer periphery of the microlens. This applies to a positive photosensitive material. In the case of a negative photosensitive material, conversely, the light transmittance is maximum at a position corresponding to a flat surface, decreases toward the outer periphery of a microlens, and is minimum at the outer periphery of the microlens.

Thereafter, the solid-state imaging device of FIG. 2A can be manufactured by steps similar to those of the first manufacturing method of this embodiment, though the steps will not be described in detail.

Next, the fifth solid-state imaging device manufacturing method of this embodiment will be described, though it is not illustrated.

In the fifth manufacturing method of this embodiment, a first insulating film, a transfer electrode, a second insulating film, a light shield film and a first planarization layer are initially successively formed in respective predetermined regions on a semiconductor substrate on which a photoelectric conversion region and a transfer channel region are provided. Next, a first microlens forming film made of a photosensitive material, such as an acrylic resin or the like, is applied onto the first planarization layer. Thereafter, exposure and development are performed with respect to the first microlens forming film, thereby shaping the first microlens forming film into a rectangular prism that is positioned immediately above the photoelectric conversion region 2, covering it.

Next, the first microlens forming film in the shape of such a rectangular prism is caused to have a surface having an upward-convex shape by heating at a glass transition temperature or higher (thermal flow technique). Thereafter, a flat plate is pressed against the first microlens forming film having the upward-convex shape, thereby forming a flat surface at a top portion of the first microlens forming film and at a region positioned immediately above the photoelectric conversion region. As a result, a first microlens having a flat surface can be formed. Thereafter, the solid-state imaging device of FIG. 2A can be manufactured by steps similar to those of the first manufacturing method of this embodiment, though the steps will not be described in detail.

As described above, according to the second to fifth solid-state imaging device manufacturing methods of this embodiment, the first microlens 9a having the flat surface 17 positioned directly above the photoelectric conversion region 2 can be formed in the flat surface forming step. Light entering the first microlens 9a can be gathered via the flat surface 17 into a middle portion of the photoelectric conversion region 2. Therefore, the second to fifth solid-state imaging device manufacturing methods of this embodiment can be used to manufacture a solid-state imaging device having a satisfactory image characteristic in which the amount of oblique incident light entering the photoelectric conversion region 2 can be reduced, so that the occurrence of a smear can be suppressed.

In the first to fifth solid-state imaging device manufacturing methods of this embodiment, a solid-state imaging device including the first microlens 9a having the flat surface 17 is manufactured by performing the "flat surface forming step" with respect to the first microlens forming film. The present invention is not limited to this. For example, after the first microlens having an upward-convex curved surface is formed, the "flat surface forming step" may be performed with respect to the second microlens forming film, so that a solid-state imaging device including the second microlens 13a having the flat surface 16 (see FIG. 1A) can be manufactured. Alternatively, after the flat surface 17 is formed on the first microlens, the flat surface 16 may be formed on the second microlens, so that a solid-state imaging device including the first microlens 9a and the second microlens 13a having the flat surfaces 17 and 16, respectively, can be manufactured. Note that, in this case, these microlenses may be flattened by the same or different "flat surface forming steps".

The solid-state imaging devices of the present invention and their manufacturing methods are useful for an increase in the number of pixels and further miniaturization of a solid-state imaging device.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

What is claimed is:

1. A solid-state imaging device comprising:
a semiconductor substrate having a photoelectric conversion region;
a first microlens provided above the semiconductor substrate, covering the photoelectric conversion region, and having a flat surface at a central region and a slope at a peripheral region
a planarization layer provided on the flat surface and the slope of the first microlens;
a color filter layer provided on the planarization layer; and
a second microlens provided above the color filter the first microlens and having a convex upper surface,
wherein a refractive index of the planarization layer is 1.4 to 1.7 and a refractive index of the first microlens is 1.9 to 2.1.

2. The solid-state imaging device of claim 1, further comprising:
a light shield film provided between the semiconductor substrate and the first microlens, and having an opening portion positioned immediately above the photoelectric conversion region,
wherein the flat surface is provided in a region within the opening portion as viewed from the top.

3. The solid-state imaging device of claim 2, wherein the flat surface has an area equal to that of the opening portion.

4. The solid-state imaging device of claim 2, wherein the flat surface of the first microlens has an area smaller than that of the opening portion.

5. The solid-state imaging device of claim 1, wherein the flat surface is in the shape of a quadrangle.

6. A solid-state imaging device comprising:
a semiconductor substrate having a photoelectric conversion region;
a first microlens provided above the semiconductor substrate, covering the photoelectric conversion region, and having a convex upper surface, for gathering external light into the photoelectric conversion region;
a second microlens provided above the first microlens and having a convex upper surface, for gathering external light into the first microlens; and
a light shield film provided between the semiconductor substrate and the first microlens and having an opening portion positioned immediately above the photoelectric conversion region;
wherein a flat surface is provided at a top portion of each of the first and second microlenses and immediately above the photoelectric conversion region;
the flat surface is provided in a region within the opening portion as viewed from the top; and
the flat surface of the first microlens has an area smaller than that of the flat surface of the second microlens and smaller than that of the opening portion.

7. A solid-state imaging device comprising:
a semiconductor substrate having a photoelectric conversion region;
a first microlens provided above the semiconductor substrate, covering the photoelectric conversion region, and having a convex upper surface, for gathering external light into the photoelectric conversion region;
a second microlens provided above the first microlens and having a convex upper surface, for gathering external light into the first microlens; and
a light shield film provided between the semiconductor substrate and the first microlens, and having an opening portion positioned immediately above the photoelectric conversion region;
wherein a flat surface is provided at a top portion of each of the first and second microlenses and immediately above the photoelectric conversion region;
the flat surface is provided in a region within the opening portion as viewed from the top; and
the flat surface of the first microlens has an area larger than that of the flat surface of the second microlens and smaller than that of the opening portion.

* * * * *